United States Patent [19]

Niedermeier et al.

[11] 4,009,238
[45] Feb. 22, 1977

[54] PROCESS FOR THE PRODUCTION OF CERAMIC SUBSTRATES FOR THIN LAYER CIRCUITS

[75] Inventors: Karl Niedermeier, Aich; Manfred Wintzer, Unterpfaffenhofen, both of Germany

[73] Assignee: Siemens Aktiengesellschaft, Berlin & Munich, Germany

[22] Filed: Mar. 11, 1974

[21] Appl. No.: 449,751

[30] Foreign Application Priority Data

Mar. 29, 1973 Germany .......................... 2315797

[52] U.S. Cl. ................................ 264/61; 264/63; 264/293; 264/325
[51] Int. Cl.² ........................................ B29D 7/22
[58] Field of Search ................ 264/63, 65, 325, 1, 264/293, 61; 425/385, 394

[56] References Cited

UNITED STATES PATENTS

| | | | |
|---|---|---|---|
| 2,952,877 | 9/1960 | Park | 264/63 |
| 2,966,719 | 1/1961 | Park | 264/66 |
| 3,016,598 | 1/1962 | Anderson | 264/66 X |
| 3,096,545 | 7/1963 | Rowland | 425/394 |
| 3,192,086 | 6/1965 | Gyurk | 264/61 X |
| 3,794,704 | 2/1974 | Strong | 264/325 X |
| 3,794,707 | 2/1974 | O'Neill et al. | 264/63 X |
| 3,879,509 | 4/1975 | Elderbaum | 264/61 X |

FOREIGN PATENTS OR APPLICATIONS 842,129 5/1970 Canada .......................... 264/61

*Primary Examiner*—Richard R. Kucia
*Attorney, Agent, or Firm*—Hill, Gross, Simpson, Van Santen, Steadman, Chiara & Simpson

[57] ABSTRACT

A process for the production of ceramic substrates for thin layer circuits utilizes a cast compound which may be transformed into a ceramic body by sintering. The compound is poured out in the form of a coating on a base, for drying whereupon a leather-like, tough, "green" substrate layer is formed from which the required shapes can be punched out and sintered. In the green, air-drying state, the substrates are exposed to a pressure of up to approximately 1000 kp/cm² between highly polished, plane parallel surfaces constituted by mirror finished surfaces of compression rams which may advantageously include highly polished surfaces of synthetic material.

4 Claims, 1 Drawing Figure

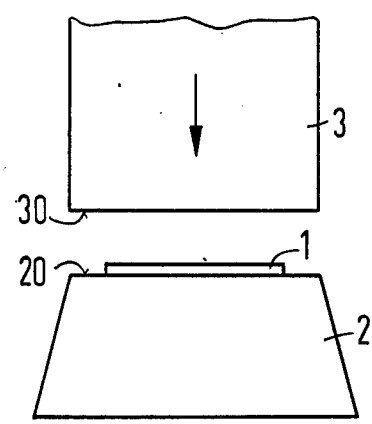

PROCESS FOR THE PRODUCTION OF CERAMIC SUBSTRATES FOR THIN LAYER CIRCUITS

BACKGROUND OF THE INVENTION

1. Field of the Invention

This invention relates to a process for the production of ceramic substrates for thin layer circuits in which a cast compound is produced, which may be transformed into a ceramic body by means of a sintering process, the compound being poured out in the form of a coating on a base to air dry and form a "green" substrate layer from which the required shape may be subsequently punched out and sintered.

2. Description of the Prior Art

The marked insulating properties of ceramic substrates make them a preferred material for the production of substrates for electronic circuits. Thin layer elements make particular requirements on the surface quality of the substrates since the layer thicknesses on such a substrate are in the region of from 100 to several 1000 A. If the roughness of the surface of a substrate is too great, no complete layers of this thickness are produced.

Substrates suitable for thin layer circuits are produced in a known manner, for example, in accordance with the German patent application 1,771,216, which has been laid open to public inspection. The object of this known process is to provide a substrate compound which remains particularly homogenous and pore-free during the sintering process. It is proposed, in particular, that alumina be used for this purpose, the granule size distribution of the material being staggered over a wide range. In order to avoid distortion during the sintering of the substrate, the latter must be weighted down with pre-sintered molded components during the sintering process. Heavy loading with molded components prevents the substrates from shrinking during the sintering process. Cracks are, however formed. On the other hand, a lighter load with molded components during sintering is not sufficient to prevent deformation and buckling of the substrates.

SUMMARY OF THE INVENTION

An object of the present invention is to produce substrates possessing a further improved surface without distortions and cracks.

The aforementioned object is achieved in a process of the type generally described above and is characterized, in accordance with the invention, in that in the green air-dry state, the substrates are exposed to a pressure of up to approximately 1000 kp/cm² between highly polished plane parallel surfaces, the term kp identifying the unit kilopond.

This surprisingly simple process step results in slight differences in thickness of the substrates being compensated and the surface quality being improved by means of the application of the smooth rams, so that finally no distortions occur during sintering. The duration of the application of pressure is approximately 1 to 3 minutes.

Mirror finished metal surfaces are provided for the compression rams. It is advantageous to coat the latter with extremely smooth surfaced synthetic layers, which avoids the substrate adhering to the rams.

An advantageous further development of the process resides in the covering of such pre-treated substrates with pre-sintered substrates or molded components during the sintering process; the surfaces are therefore protected from furnace dirt. A particular advantage of the process carried out in accordance with the invention is that the weighting of the substrates which are to be sintered may be omitted without any decrease in quality.

The substrates produced in a process according to the present invention possess an approximately 30% lower degree of surface roughness in comparison to those produced by conventional processes. Irregularities in the layer thickness are compensated due to the application of the pressure set forth herein.

After the sintering step, the surface quality was measured with a Perth-o-meter which is manufactured by the Perthen firm. In the measurement process, the movement of a diamond needle corresponding to the scanned profile was amplified and recorded electrically. In the case of substrates produced by the process of the present invention, there was an average surface roughness Ra of 0.07 to 0.10 μm. Substrates produced without the compensation of the green substrate layers in accordance with the invention exhibited surface roughness values of between 0.1 and 0.170 μm. These values relate to the cast compound formula as stated below.

DESCRIPTION OF THE PREFERRED EMBODIMENT

For the production of a cast compound, alumina is ground and provided with a solvent and a bonding agent, whereby the solvent is soluble with respect to the bonding agent, and softens at low temperatures during the drying of the cast compound. Even after the softening of the solvent, the bonding agent holds the alumina particles together. The bonding agent does not soften until the sintering temperature is reached, and then without giving rise to cracks and apertures.

The process carried out in accordance with the present invention will improve the surface quality of the finished substrate in the case of any cast compound. The following compound is, however, particularly advantageous:

| COMPOUND | MASS |
| --- | --- |
| $Al_2O_3$ | 60.6 g |
| Polyvinylbutyral | 3.3 g |
| Polyethylene glycol-bis 2-ethylcapronate | 4.8 g |
| Alkylphenylether of polyethylene glycol | 1.2 g |
| Ethanel | 23.0 g |
| Toluene | 9.7 g |
| Talc | 0.3 g |

The sintering temperature is provided to be between 1200° C and 1500° C.

The single FIGURE of the drawings schematically illustrates the compression of the ceramic substrates.

Referring to the drawing, the substrate 1 of a suitable compound, such as those listed above, is introduced between the compression rams 2 and 3. The arrow in the ram 3 symbolizes the compression movement. The surfaces 20 and 30 of the compression rams are highly polished plane parallel surfaces, and these surfaces are preferably mirror finished metal surfaces.

In a further preferred embodiment of the invention, the surfaces 20 and 30 are highly polished surfaces of synthetic material.

The compression of the substrates is followed by a sintering process, as is well known in the art.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a process for the production of ceramic substrates for thin layer circuits in which a cast compound is produced and poured out in the form of a coating on a base in order to dry so that a leather-like tough, green substrate layer is formed from which the required shapes can be punched out and then sintered, the sintering transforming the green substrate into a ceramic body from which the required shapes of ceramic substrates can be punched out, the improvement therein comprising the step of:

subjecting the green dried substrates to a pressure of up to approximately 1000 kilopond/cm between highly polished, plane parallel surfaces.

2. The improvement set forth in claim 1 wherein the step of subjecting the substrates to a pressure is further defined as squeezing the substrates between compression rams having mirror finished metal surfaces.

3. The improvement set forth in claim 1 wherein the step of subjecting the substrates to a pressure is further defined as squeezing the substrates between compression rams having highly polished surfaces of synthetic material.

4. The improvement set forth in claim 1, further defined as applying the pressure for a period of time of from 1 to 3 minutes.

* * * * *